(12) United States Patent
Jung et al.

(10) Patent No.: US 11,196,018 B2
(45) Date of Patent: Dec. 7, 2021

(54) DISPLAY DEVICE AND MANUFACTURING METHOD THEREOF

(71) Applicants: Samsung Display Co., Ltd., Yongin-si (KR); Dankook University Cheonan Campus Industry Academic Cooperation Foundation, Cheonan-si (KR)

(72) Inventors: Kyung Ho Jung, Seongnam-si (KR); Byung Min Park, Daejeon (KR); Kwan Young Han, Seongnam-si (KR)

(73) Assignees: Samsung Display Co., Ltd., Yongin-si (KR); Dankook University Cheonan Campus Industry Academic Cooperation Foundation, Cheonan-si (KR)

( * ) Notice: Subject to any disclaimer, the term of this patent is extended or adjusted under 35 U.S.C. 154(b) by 0 days.

(21) Appl. No.: 16/410,313

(22) Filed: May 13, 2019

(65) Prior Publication Data

US 2019/0348630 A1 Nov. 14, 2019

(30) Foreign Application Priority Data

May 14, 2018 (KR) .......................... 10-2018-0054710

(51) Int. Cl.
*H01L 51/54* (2006.01)
*H01L 51/52* (2006.01)
(Continued)

(52) U.S. Cl.
CPC ............ *H01L 51/5246* (2013.01); *B32B 7/12* (2013.01); *B32B 37/12* (2013.01);
(Continued)

(58) Field of Classification Search
CPC . H01L 51/5246; H01L 51/56; H01L 51/0094; H01L 2251/558; H01L 27/3244;
(Continued)

(56) References Cited

U.S. PATENT DOCUMENTS

2004/0080264 A1* 4/2004 Ichikawa ............... H05B 33/28
313/501
2007/0285777 A1* 12/2007 Toyoshima ............ G02B 5/305
359/487.05

(Continued)

FOREIGN PATENT DOCUMENTS

JP 07-003222 6/1995
KR 10-2015-0125886 11/2015
(Continued)

*Primary Examiner* — Samuel Park
(74) *Attorney, Agent, or Firm* — H.C. Park & Associates, PLC

(57) ABSTRACT

A display device including: a display panel; a cover plate disposed on the display panel; and an adhesive layer disposed between the display panel and the cover plate, wherein the adhesive layer includes a main adhesive layer and a thin film layer, the thin film layer includes a first thin film layer and a second thin film layer disposed on the first thin film layer, the first thin film layer contains a siloxane functional group and the second thin film layer contains fluorine, and the second thin film layer is disposed between the first thin film layer and the cover plate.

15 Claims, 15 Drawing Sheets

(51) Int. Cl.
*H01L 51/56* (2006.01)
*B32B 7/12* (2006.01)
*B32B 37/12* (2006.01)
*H01L 51/00* (2006.01)
*H01L 27/32* (2006.01)

(52) U.S. Cl.
CPC .......... *H01L 51/0094* (2013.01); *H01L 51/56* (2013.01); *B32B 2457/206* (2013.01); *H01L 27/3244* (2013.01); *H01L 51/5284* (2013.01); *H01L 2251/558* (2013.01)

(58) Field of Classification Search
CPC ............. H01L 51/5284; H01L 51/5237; H01L 51/5253; B32B 7/12; B32B 37/12; B32B 2457/206
See application file for complete search history.

(56) References Cited

U.S. PATENT DOCUMENTS

| | | | |
|---|---|---|---|
| 2014/0061970 A1* | 3/2014 | Sekine | C09D 151/006 264/293 |
| 2015/0034916 A1* | 2/2015 | Lee | H01L 51/5253 257/40 |
| 2015/0275029 A1* | 10/2015 | Matsushita | C09D 137/00 428/209 |
| 2015/0315425 A1 | 11/2015 | Mun et al. | |
| 2016/0215217 A1* | 7/2016 | Akiyama | C09K 19/3068 |
| 2017/0152404 A1 | 6/2017 | Niimi et al. | |
| 2017/0260425 A1 | 9/2017 | Yamamoto et al. | |
| 2020/0312822 A1 | 10/2020 | Kim et al. | |
| 2020/0332146 A1 | 10/2020 | Kong et al. | |

FOREIGN PATENT DOCUMENTS

| | | |
|---|---|---|
| KR | 10-2016-0140722 | 12/2016 |
| KR | 10-2017-0088833 | 8/2017 |
| WO | 2015/151222 | 10/2015 |

* cited by examiner

DISPLAY DEVICE AND MANUFACTURING METHOD THEREOF

CROSS-REFERENCE TO RELATED APPLICATION

This application claims priority from and the benefit of Korean Patent Application No. 10-2018-0054710, filed on May 14, 2018, which is hereby incorporated by reference for all purposes as if fully set forth herein.

BACKGROUND

Field

Exemplary embodiments of the invention relate generally to a display device and a manufacturing method thereof and, more specifically, to a display device in which a thin film layer containing a siloxane functional group and fluorine is formed in an adhesive layer to facilitate rework, and a manufacturing method thereof.

Discussion of the Background

A display device includes a display panel for displaying an image and a cover window for protecting the display panel. An adhesive layer is used to attach the display panel and the cover window.

In this case, an adhesive layer is formed on one of the display panel and the cover plate and the other is adhered on the adhesive layer. Defects, such as bubbles, foreign materials, lifting, etc., may occur during this adhering process.

The cover window and the display panel are relatively expensive components among unit parts constituting the display device. Accordingly, when a defect occurs during the adhering process, a rework process is required to recycle it. The rework process serves to separate the window and the display panel from each other. In this case, it is important to ensure that the display panel or the window is not damaged during this separating process.

The above information disclosed in this Background section is only for understanding of the background of the inventive concepts, and, therefore, it may contain information that does not constitute prior art.

SUMMARY OF THE INVENTION

Exemplary embodiments of the invention provide a display device in which a thin film layer containing a siloxane functional group and fluorine is formed in an adhesive layer to facilitate rework, and a manufacturing method thereof.

Additional features of the inventive concepts will be set forth in the description which follows, and in part will be apparent from the description, or may be learned by practice of the inventive concepts.

An exemplary embodiment of the present invention provides a display device including: a display panel; a cover plate disposed on the display panel; and an adhesive layer disposed between the display panel and the cover plate. The adhesive layer includes a main adhesive layer and a thin film layer, the thin film layer includes a first thin film layer and a second thin film layer disposed on the first thin film layer, the first thin film layer contains a siloxane functional group and the second thin film layer contains fluorine, and the second thin film layer is disposed between the first thin film layer and the cover plate.

The second thin film layer may contact the cover plate.

A thickness of the first thin film layer may be in a range of 1 nm to 10 μm.

A thickness of the second thin film layer may be in a range of 1 nm to 10 μm.

The first thin film layer may include a compound represented by Chemical Formula 1.

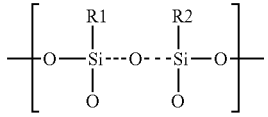

Chemical Formula 1

Here, R1 and R2 indicate carbon-containing functional groups.

The second thin film layer may include a compound represented by Chemical Formula 2.

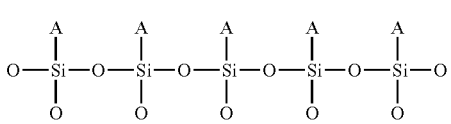

Chemical Formula 2

Here, A may indicate a fluorine-containing functional group.

The thin film layer may be disposed in a region of the main adhesive layer.

The thin film layer may overlap an area of 1% to 100% of an entire region of the main adhesive layer.

The thin film layer may have a shape formed of a plurality of islands that are spaced apart.

The thin film layer may have a shape formed of a plurality of bars that are spaced apart.

Light transmittance in visual light regions of the first thin film layer and the second thin film layer may be 92% or more.

Haze values of the first thin film layer and the second thin film layer may be 0.3 or less.

A contact angle of the second thin film layer may be equal to or greater than 105°.

Surface energy of the second thin film layer may be equal to or less than 20 mN/m.

Another exemplary embodiment of the present invention provides a manufacturing method of a display device, including: preparing a display panel; forming an adhesive layer in the display panel; and attaching a cover plate onto the adhesive layer. The forming of the adhesive layer includes preparing a main adhesive layer, forming a first thin film layer containing a siloxane functional group on the main adhesive layer, and forming a second thin film layer containing fluorine on the first thin film layer.

The forming of the first thin film layer containing a siloxane functional group on the main adhesive layer and the forming of the second thin film layer containing fluorine on the first thin film layer may be performed by using a thermal vacuum deposition method, a spray coating method, or a dip coating method.

The manufacturing method may further include positioning a mask on the main adhesive layer, between the preparing of the main adhesive layer and the forming of the first thin film layer containing a siloxane functional group on the main adhesive layer.

An opening area of the mask may be in a range of 2% to 50%.

A thickness of the first thin film layer may be in a range of 1 nm to 10 μm, and a thickness of the second thin film layer may be in a range of 1 nm to 10 μm.

The first thin film layer may contain a compound represented by Chemical Formula 1, and the second thin film layer may contain a compound represented by Chemical Formula 2.

Chemical Formula 1

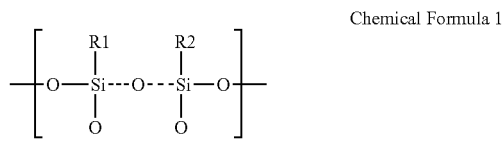

Here, R1 and R2 may indicate carbon-containing functional groups.

Chemical Formula 2

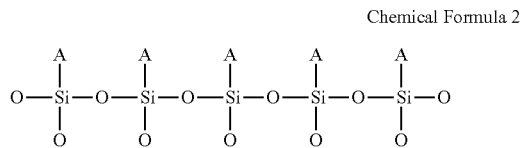

Here, A indicates a fluorine-containing functional group.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
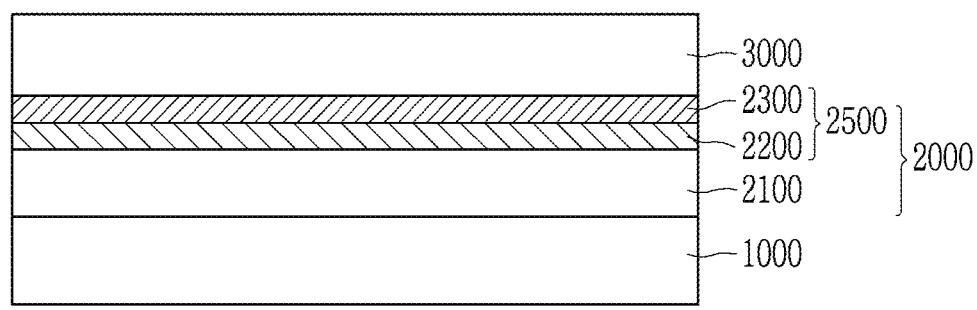
FIG. 1 is a cross-sectional view schematically illustrating a display device according to an exemplary embodiment of the present invention.

In the following description, for the purposes of explanation, numerous specific details are set forth in order to provide a thorough understanding of various exemplary embodiments of the invention. As used herein "embodiments" are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are shown in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

Unless otherwise specified, the illustrated exemplary embodiments are to be understood as providing exemplary features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z-axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Hereinafter, a display device according to an exemplary embodiment of the present invention will be described in detail with reference to the accompanying drawings.

FIG. 1 is a cross-sectional view schematically illustrating a display device according to an exemplary embodiment of the present invention. Referring to FIG. 1, the display device according to the present exemplary embodiment includes a display panel 1000, a cover plate 3000 positioned on the display panel 1000, and an adhesive layer 2000 positioned between the display panel 1000 and the cover plate 3000.

The adhesive layer 2000 includes a main adhesive layer 2100, a first thin film layer 2200, and a second thin film layer 2300. The main adhesive layer 2100, the first thin film layer 2200, and the second thin film layer 2300 are sequentially positioned, and the second thin film layer 2300 is positioned between the first thin film layer 2200 and the cover plate 3000 to contact the cover plate 3000. The first thin film layer 2200 may contain a siloxane functional group, and the second thin film layer 2300 may contain fluorine.

In the description which follows, the first thin film layer 2200 and the second thin film layer 2300 are collectively referred to as a "thin film layer 2500". In the display device according to present exemplary embodiment, the thin film layer 2500 controls surface energy of the adhesive layer 2000 to prevent residue of the adhesive layer 2000 when the display panel 1000 and the cover plate 3000 are separated from each other during the process. Accordingly, rework is facilitated in the manufacturing process. In the description which follows, the rework indicates a process of separating the display panel 1000 and the cover plate 3000 and re-adhering them. Detailed configurations and effects relating to the thin film layer 2500 will be described later.

The display panel 1000 may be an organic light emitting diode display panel. However, the inventive concepts are not limited thereto, and the display panel may be a liquid crystal panel including liquid crystal. In addition, an emission layer may contain an inorganic material, such as quantum dots rather than an organic material. A detailed structure of the display panel 1000 will be provided later.

The main adhesive layer 2100 may include a transparent optically clear adhesive. The main adhesive layer 2100 may transmit 97% or more of light. The main adhesive layer 2100 has both viscosity and elasticity, and adheres the display panel 1000 and the cover plate 3000 to each other. Since the main adhesive layer 2100 is transparent, an image of the display panel 1000 may be introduced into the cover plate 3000. In addition, the main adhesive layer 2100 is viscous enough to adhere the cover plate 3000 and the display panel 1000. Accordingly, unlike an adhesive layer in which a chemical change occurs, it is possible to remove the cover plate 3000 and the display panel 1000 again when the cover plate 3000 and the display panel 1000 are improperly adhered to each other.

The cover plate 3000, which serves to protect the display panel 1000, may be a cover window or a cover film. The cover plate 3000 may be made of glass, but may be made of a film or the like according to an exemplary embodiment. Particularly, when the display device is a flexible or foldable display device, the cover plate 3000 may be a film. A light blocking member or the like may be positioned on a surface of the cover plate 3000, and the light blocking member functions as a bezel of the display device and covers the non-display area.

In the manufacturing process of the display device, the cover plate 3000 and the display panel 1000 are adhered to each other by using the adhesive layer 2000. During this process, defects, such as bubbles, foreign substances, lifting, and misalignment may occur. In this case, the process (rework) of separating the display panel 1000 and the cover plate 3000 and re-adhering them is performed. In the rework process, a part of the adhesive layer 2000 may remain on the cover plate 3000 and the display panel 1000 due to a strong adhesive force of the adhesive layer 2000. Although a cleaning process may be carried out to remove adhesive matter remaining therein, its removal may not be easy due to the strong adhesive force of the adhesive layer. As a result, the adhesive matter remaining in the rework process causes secondary contamination. In addition, the display panel 1000 or the cover plate 3000 may be damaged in the step of removing the adhesive foreign matter.

However, in the display device according to the present exemplary embodiment, the adhesive layer 2000 includes the main adhesive layer 2100, the first thin film layer 2200, and the second thin film layer 2300. The first thin film layer 2200 contains a siloxane functional group, and the second thin film layer 2300 contains fluorine. The first thin film layer 2200 containing a siloxane functional group and the second thin film layer 2300 containing fluorine may solve the problem of the adhesive foreign matter remaining in the rework process by controlling surface energy of the main adhesive layer 2100. For example, adhesion of the main adhesive layer 2100 is reduced to about 90% by application of the thin film layer 2500, and no residual adhesive foreign matter remains in the rework process by the action of the reduced adhesion.

In this case, a thickness of the first thin film layer 2200 may be in a range of about 1 nm to 10 μm. The first thin film layer 2200 contains a siloxane functional group. The first thin film layer 2200 may increase the adhesion to the surface of the main adhesive layer 2100 to allow the adhesion to occur well between the main adhesive layer 2100 and the second thin film layer 2300 containing fluorine.

However, when the thickness of the first thin film layer 2200 is 1 nm or less, an adhesion reduction effect may not be sufficiently provided. When the thickness of the first thin film layer 2200 is 10 μm or more, transmittance thereof may be reduced or haze thereof may be increased, thereby deteriorating the display quality.

The thickness of the second thin film layer 2300 may be in a range of 1 nm to 10 μm. The second thin film layer 2300 contains fluorine and is hydrophobic. As a result, the adhesion may be reduced between the second thin film layer 2300 and the cover plate 3000.

However, when the thickness of the second thin film layer 2300 is 1 nm or less, the second thin film layer 2300 may not have sufficient hydrophobicity, thereby insufficiently decreasing the adhesion. When the thickness of the second thin film layer 2300 is 10 μm or more, transmittance thereof may be reduced or haze thereof may be increased, thereby deteriorating the display quality.

In the present exemplary embodiment, the first thin film layer 2200 may include a compound represented by following Chemical Formula 1.

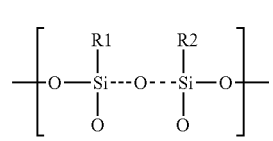

Chemical Formula 1

Here, R1 and R2 indicate carbon-containing functional groups. For example, R1 and R2 may indicate a C1 to C30 alkyl or alkenyl.

In addition, the second thin film layer 2300 may include a compound represented by following Chemical Formula 2.

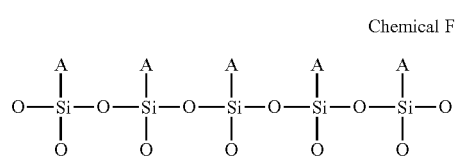

Chemical Formula 2

Here, A indicates a fluorine-containing functional group.

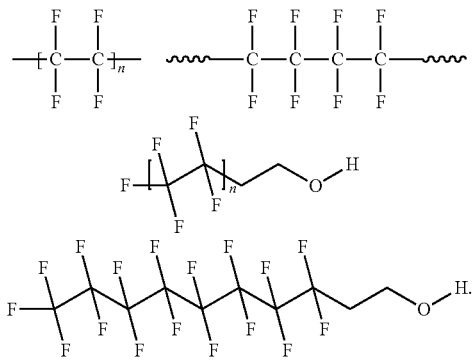

In the present exemplary embodiment, light transmittance in visual light regions of the first thin film layer 2200 and second thin film layer 2300 may be 92% or more. In addition, haze of the first thin film layer 2200 and the second thin film layer 2300 may be 0.3 or more.

Hereinafter, an effect of introduction of the thin film layer 2500 will be described based on specific experimental results. The first thin film layer 2200 and the second thin film layer 2300 can be formed by a thermal vacuum deposition method or a spray coating method. In the present exemplary embodiment, the spray coating method is used as an example.

Figure 2:
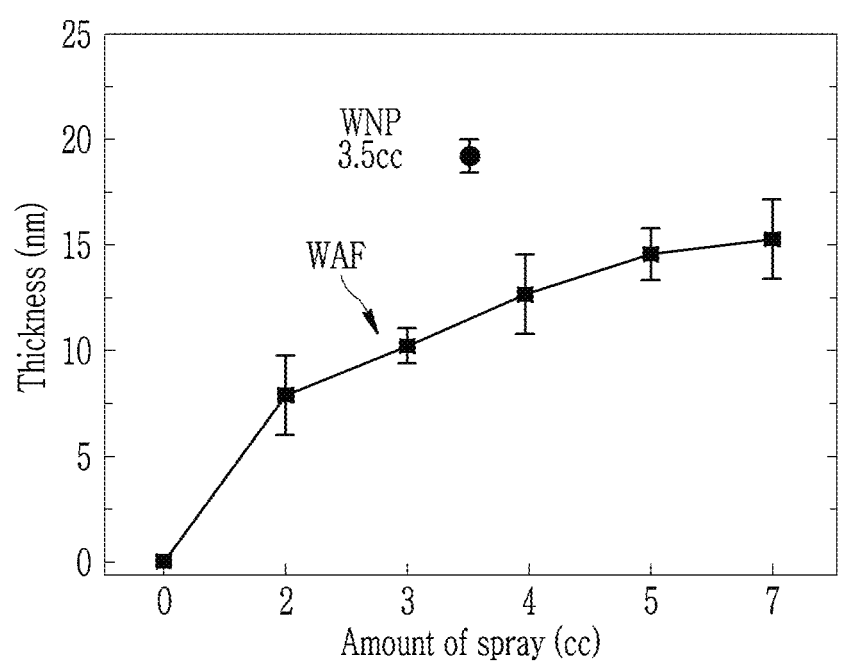
FIG. 2 is a graph illustrating a formation thickness vs. an amount of spray of a first thin film layer and a formation thickness vs. an amount of spray of a second thin film layer.

FIG. 2 is a graph illustrating a formation thickness vs. an amount of spray of the first thin film layer 2200 and a formation thickness depending on an amount of spray of the second thin film layer 2300. In the graph, a result of the first thin film layer 2200 is denoted by 'WNP', and a result of the second thin film layer 2300 is denoted by 'WAF'.

Referring to FIG. 2, it is seen that a thickness of the second thin film layer 2300 is increased depending on a spray amount.

In this case, a stacked thickness of the second thin film layer 2300 depending on the spray amount is summarized in Table 1 below.

TABLE 1

| No. | Amount of spray (cc) | Thickness (nm) |
|---|---|---|
| 1 | 2.0 | 7.8 |
| 2 | 3.0 | 10.2 |
| 3 | 4.0 | 12.6 |
| 4 | 5.0 | 14.6 |
| 5 | 7.0 | 15.3 |

Figure 3:
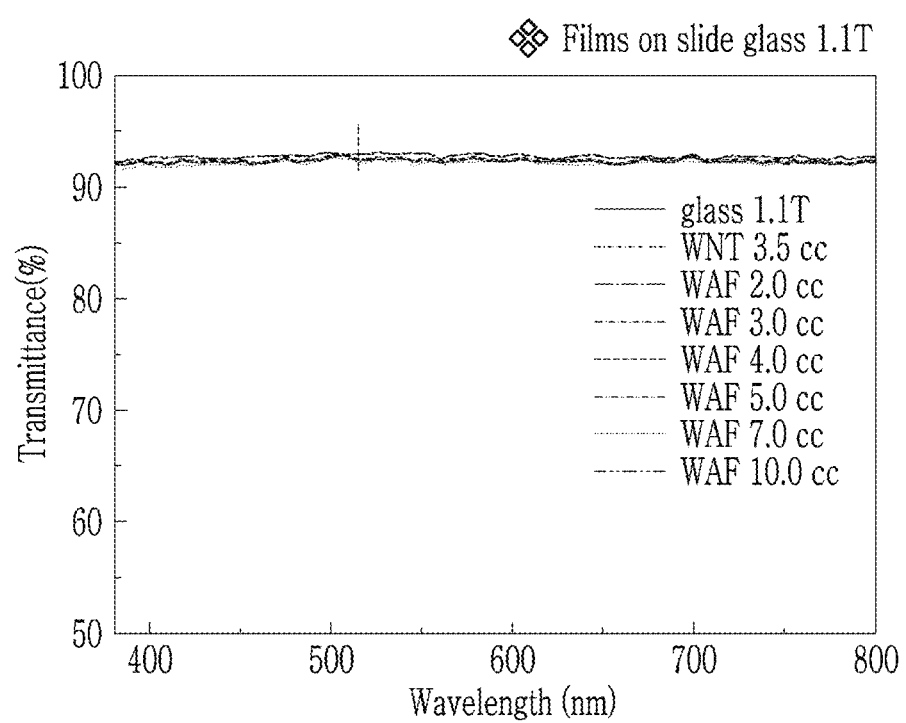
FIG. 3 is a graph illustrating measured transmittances vs. wavelength for various thicknesses of a first thin film layer and a second thin film layer.
Figure 4:
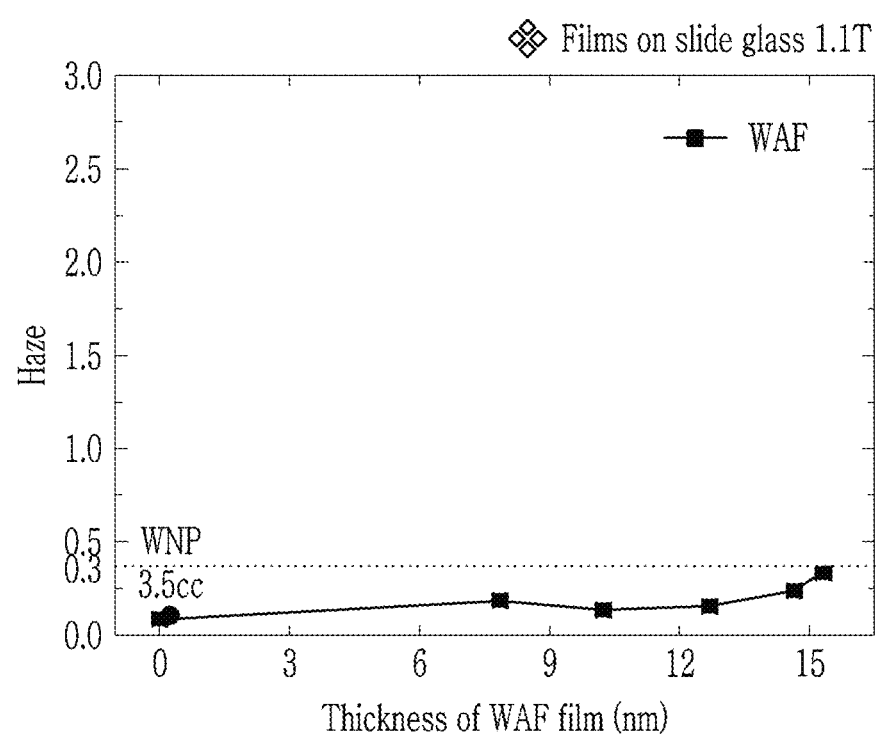
FIG. 4 is a graph illustrating haze characteristics vs. thicknesses of a first thin film layer and a second thin film layer.

FIG. 3 is a graph illustrating measured transmittances vs. wavelength for various thicknesses of the first thin film layer 2200 and the second thin film layer 2300. FIG. 4 is a graph illustrating haze characteristics depending on the thicknesses of the first thin film layer 2200 and the second thin film layer 2300. In the graphs, a result of the first thin film layer 2200 is denoted by 'WNP' and a result of the second thin film layer 2300 is denoted by 'WAF'. In FIG. 3, the thicknesses of the first thin film layer 2200 and the second thin film layer 2300 are indicated by the amount of spray, but this may be replaced with the thickness through the result of FIG. 2. Referring to FIG. 3, it is seen that the light transmittance in visual light regions of the first thin film layer 2200 and second thin film layer 2300 is 92% or more. That is, the second thin film layer 2300 containing fluorine exhibits light transmittance of 92% in the entire visible ray region regardless of an injection amount (thickness). Therefore, it is seen that when they are applied as the adhesive layer 2000 of the display device, the display quality is not particularly affected.

In addition, referring to FIG. 4, it is seen that haze values of the first thin film layer 2200 and the second thin film layer 2300 are 0.3 or less. Particularly, in the case of the second thin film layer 2300, it is seen that the haze value is maintained at 0.3 or less with a thickness of 15 nm or less. Therefore, even when they are applied as the adhesive layer 2000 of the display device, the display quality is not particularly affected.

In addition, in the display device according to the present exemplary embodiment, a contact angle of the second thin film layer 2300 may be equal to or greater than 105°. Surface energy of the second thin film layer 2300 may be equal to or less than 20 mN/m.

Figure 5:
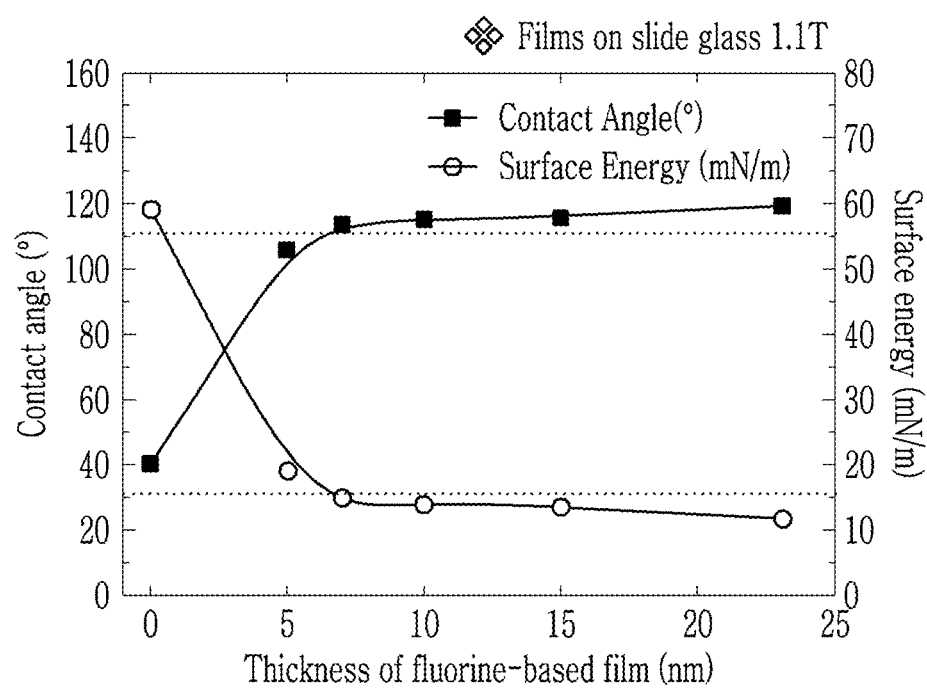
FIG. 5 is a graph illustrating a contact angle and surface energy vs. a thickness of a second thin film layer.

FIG. 5 is a graph illustrating the contact angle and the surface energy depending vs. a thickness of the second thin film layer 2300. Referring to FIG. 5, it is seen that when the thickness of the second thin film layer 2300 is more than 5 nm, the contact angle of the second thin film layer 2300 is equal to or greater than 105° and the surface energy of the second thin film layer 2300 is equal to or less than 20 mN/m.

As described above, since the fluorine-containing second thin film layer 2300 is hydrophobic and has low surface energy, the adhesion of the adhesive layer 2000 may be reduced.

Figure 6:
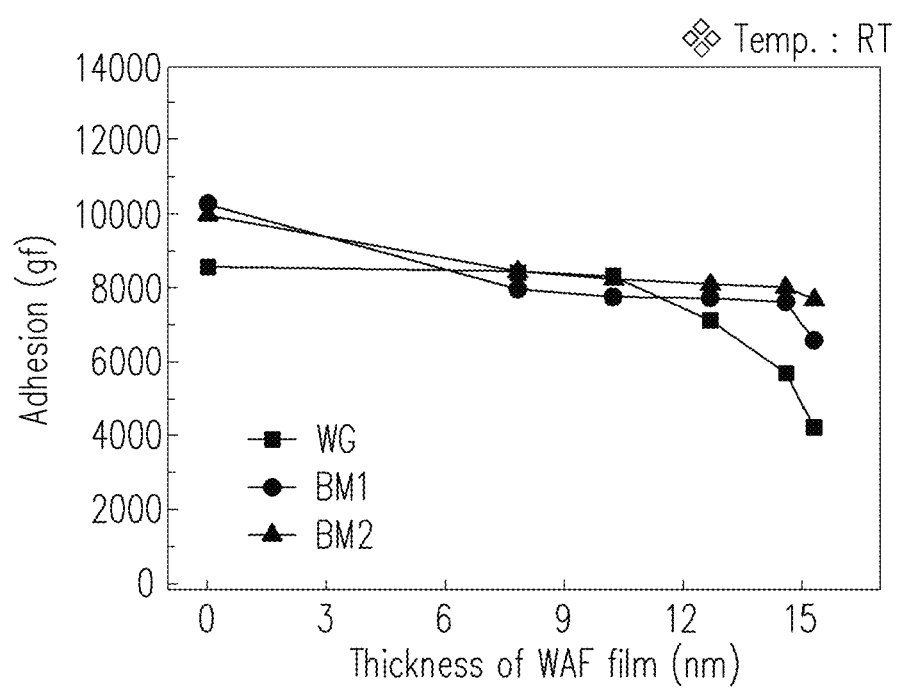
FIG. 6 is a graph illustrating adhesion depending on a thickness of a second thin film layer.

FIG. 6 is a graph illustrating adhesion vs. a thickness of the second thin film layer. Referring to FIG. 6, it is seen that as the thickness of the second thin film layer becomes thicker, adhesion with a cover glass WG, a first light blocking member BM1, and a second light blocking member BM2 is reduced.

Specifically, the cover glass WG has initial adhesion of about 8608.2 gf, and the initial adhesion of the second thin film layer is reduced to about 4229.8 gf as the thin film thickness is increased. The first light blocking member BM1 has initial adhesion of about 10299 gf, and the initial adhesion is reduced to about 6619.8 gf as the thickness of the second thin film layer is increased. In addition, the second light blocking member BM2 has initial adhesion of about 10044 gf, and is reduced to about 7672.4 gf in response to the thickness increase of the second thin film layer. From the result, it is seen that in the case of the cover glass, 90% of the initial adhesion is obtained when the thickness of the second thin film layer 2300 is about 10.2 nm.

Hereinafter, a display device according to another exemplary embodiment will be described.

Figure 7:
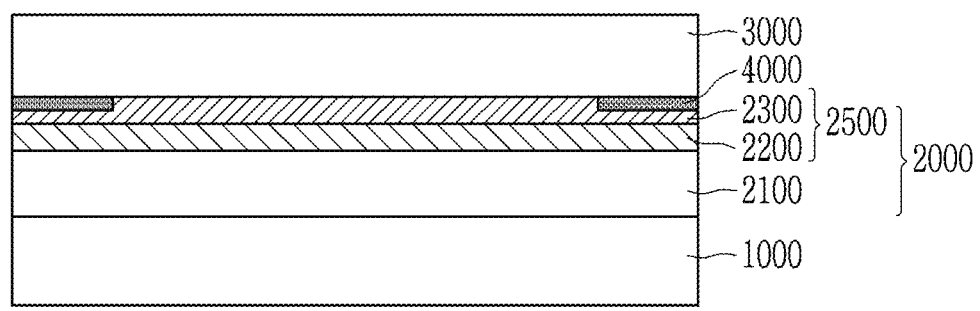
FIG. 7 is a cross-sectional view schematically illustrating an exemplary embodiment of the present invention.

FIG. 7 is a cross-sectional view schematically illustrating an exemplary embodiment of the present invention. Referring to FIG. 7, a detailed configuration of FIG. 7 is the same as that of FIG. 1. Detailed description of the same constituent elements is omitted, and the description of FIG. 1 is applied to that of FIG. 7.

However, referring to FIG. 7, the display device according to the exemplary embodiment of FIG. 7 includes a light blocking member 4000 disposed at an edge of the cover plate 3000. The light blocking member 4000, which is a bezel region of the display device, serves to cover the non-display area. Typically, the light blocking member 4000 is printed on a rear surface of the cover plate 3000. The light blocking member 4000 has a surface characteristic that has an excellent bonding force with the adhesive layer 2000. This is because the light blocking member 4000 may include an organic material and the adhesive layer 2000 is also an organic material, so a reaction occurs on the surface. Accordingly, a remainder of the adhesive layer 2000 may be positioned in the light blocking member 4000 during the rework of the adhesive layer 2000, and the light blocking member 4000 may be damaged in an operation of removing it.

However, according to the present exemplary embodiment, the adhesive layer 2000 includes a main adhesive layer 2100, a first thin film layer 2200, and a second thin film layer 2300, wherein the first thin film layer 2200 contains a siloxane functional group and the second thin film layer 2300 contains fluorine, so as to reduce the adhesion of the entire adhesive layer 2000 to about 90%. Accordingly, it is possible to solve the problem that the adhesive layer 2000 remains on the display panel 1000 or the cover plate 3000 during the rework, and it is possible to prevent damage to the light blocking member 4000 even in the display device having the structure as illustrated in FIG. 7.

The thin film layer 2500 including the first thin film layer 2200 and the second thin film layer 2300 may be disposed on a every surface of the main adhesive layer 2100, or may be disposed only in some regions.

Figure 8:
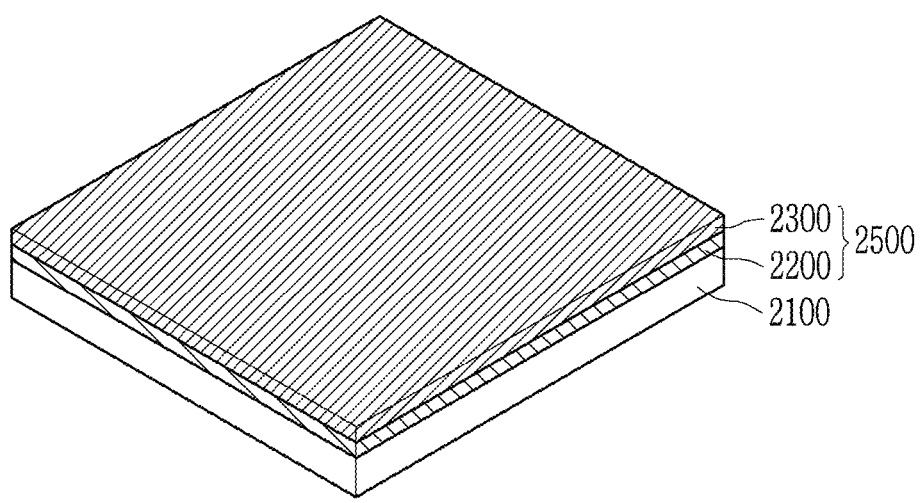
FIG. 8 and FIG. 9 are perspective views separately illustrating an adhesive layer in a display device according to an exemplary embodiment.
Figure 9:
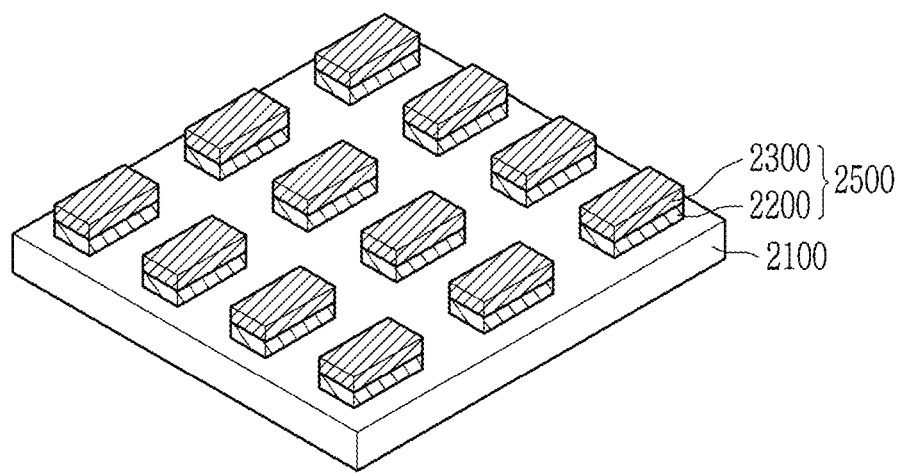

FIG. 8 and FIG. 9 are perspective views separately illustrating the adhesive layer 2000 in the display device. Referring to FIG. 8, the thin film layer 2500 may be disposed to overlap the front surface of the main adhesive layer 2100.

Alternatively, referring to FIG. 9, the thin film layer 2500 may only be disposed in some regions of the main adhesive layer 2100. In this case, the thin film layer 2500 may overlap an area of 1% to 100% of the entire region of the main adhesive layer 2100. As an area where the thin film layer 2500 overlaps the main adhesive layer 2100 is expanded, the adhesion of the adhesive layer 2000 is reduced. Therefore, the degree of overlap of the thin film layer 2500 and the main adhesive layer 2100 may be adjusted in consideration of the adhesion of the adhesive layer 2000 and the remainder of the rework.

Referring to FIG. 9, the thin film layer 2500 may have a shape formed of a plurality of islands that are spaced apart at regular intervals. In this case, each of the islands may be quadrangular. In addition, a region where the thin film layer 2500 is not disposed in the main adhesive layer 2100 may have a lattice shape. However, the structure of FIG. 9 is merely an example, and the thin film layer 2500 may be coated in various shapes such as a plurality of circular, polygonal, and linear shapes. Such a plurality of islands may be regularly arranged or randomly distributed.

Figure 10:
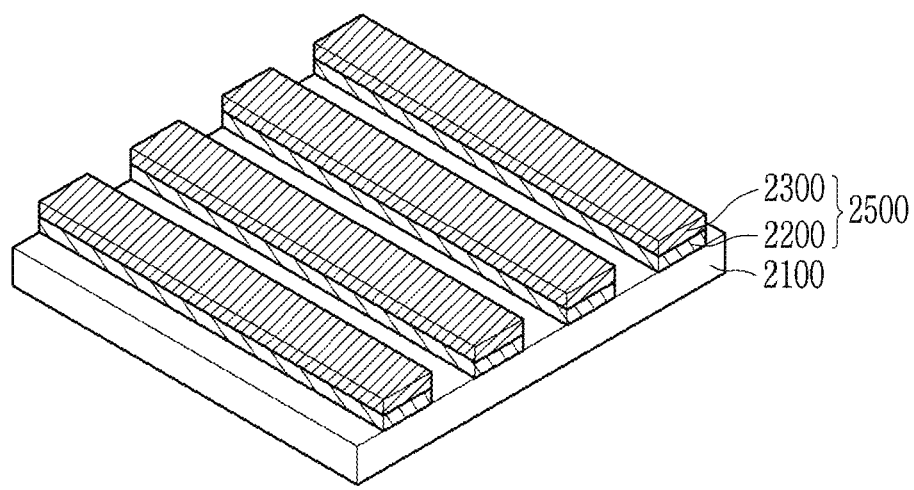
FIG. 10 and FIG. 11 are perspective views illustrating an adhesive layer according to an exemplary embodiment.
Figure 11:
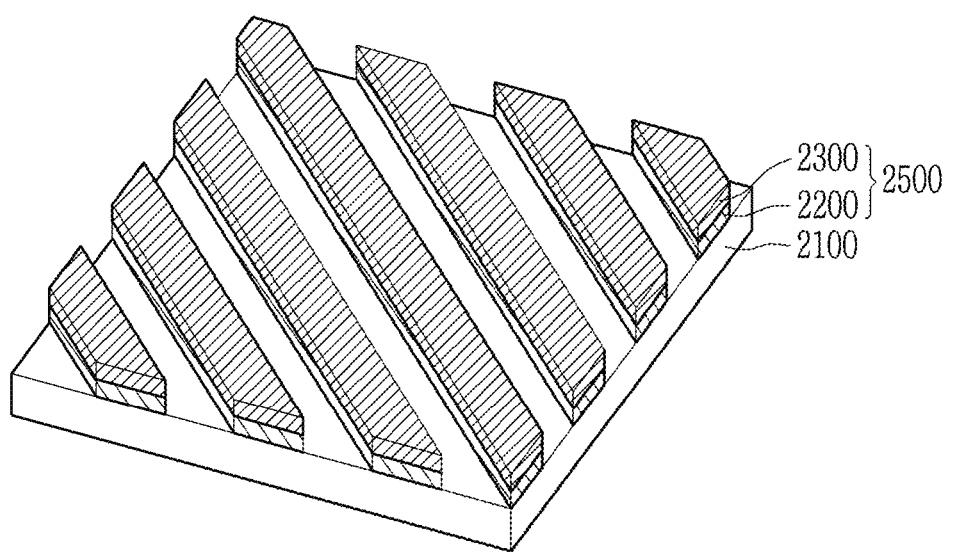

In addition, the arrangement of the thin film layer 2500 is not limited to the lattice structure as illustrated in FIG. 9. The thin film layer 2500 may have a stripe shape as illustrated in FIG. 10, and the thin film layer 2500 may be arranged in a diagonal direction as illustrated in FIG. 11.

Figure 12:
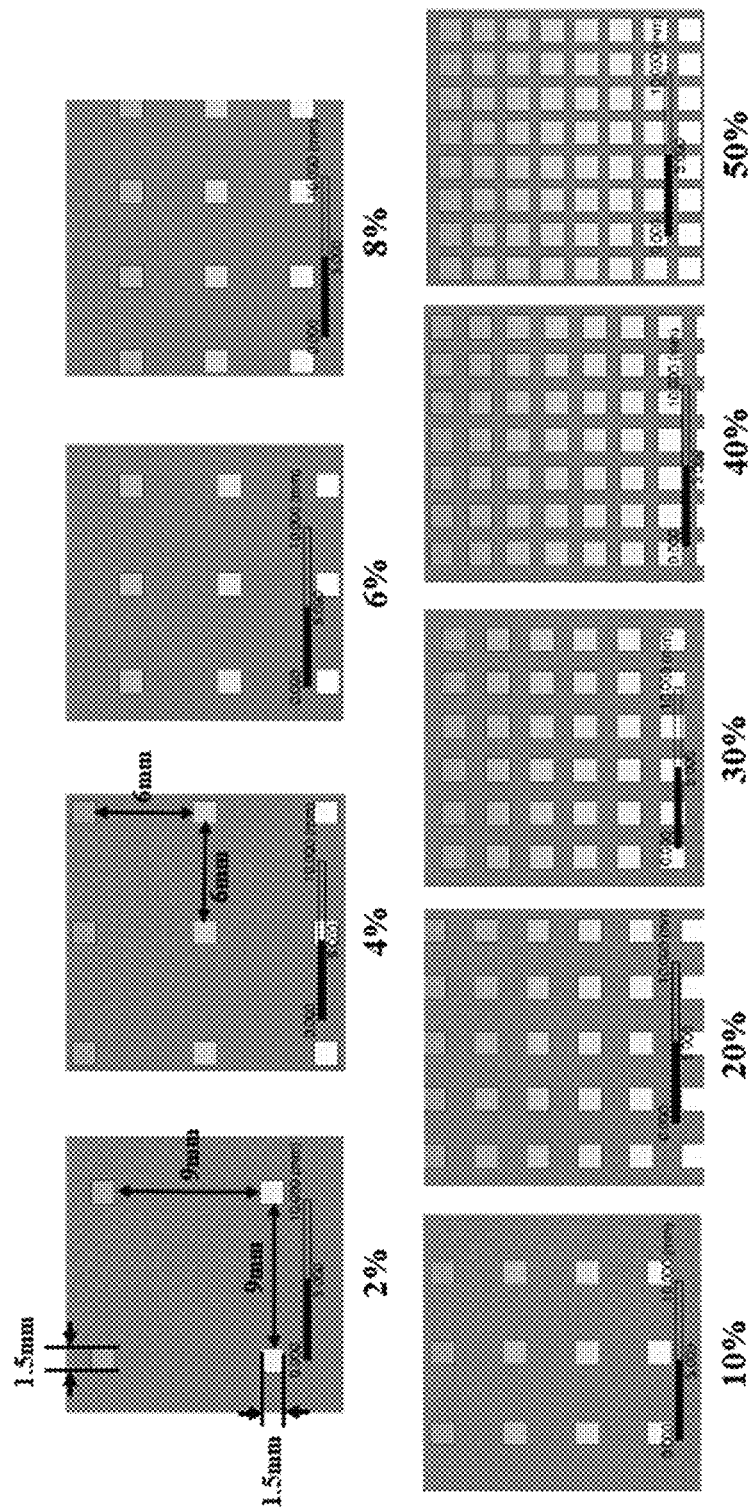
FIG. 12 illustrates a mask simulation model for forming a thin film layer having a structure as illustrated in FIG. 9.
Figure 13:
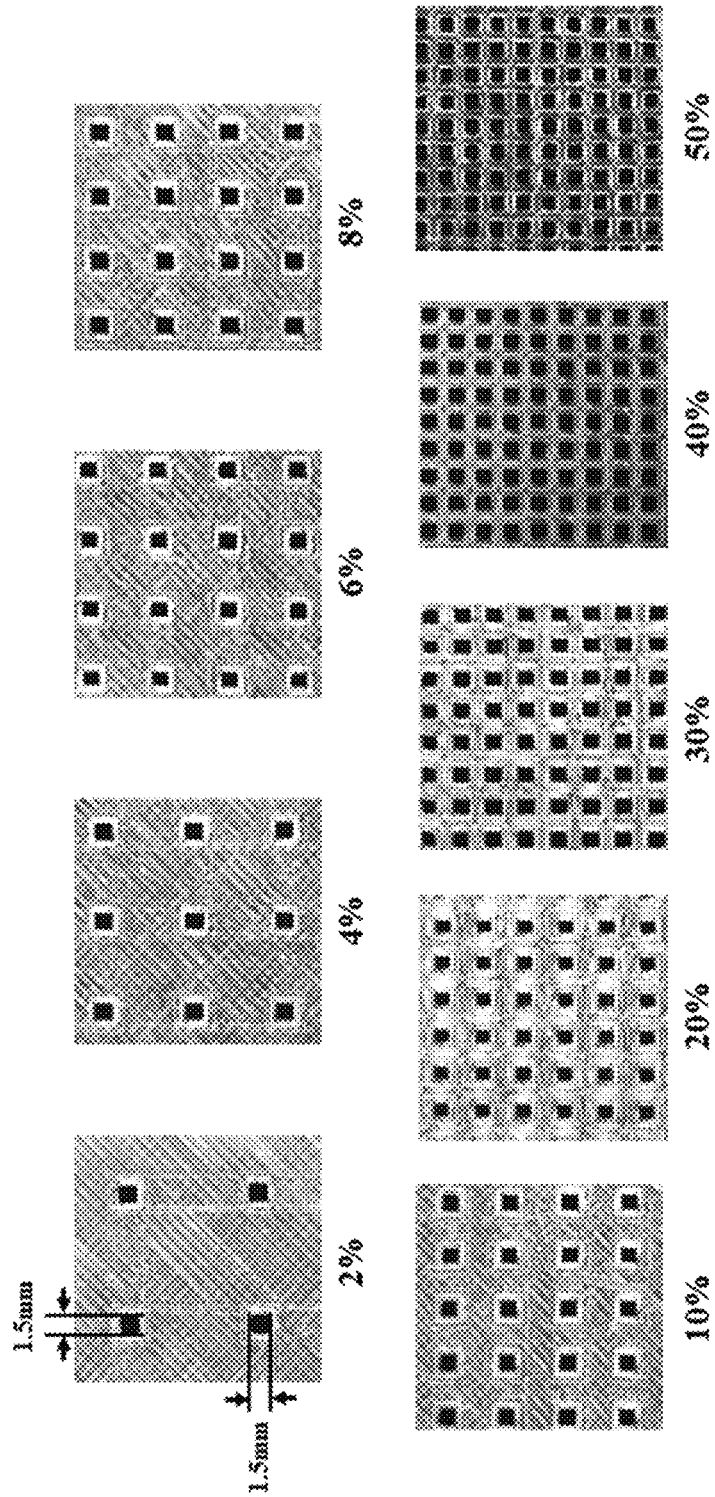
FIG. 13 illustrates a mask manufactured based on the simulation model of FIG. 12 by using an actual 3D printer.

FIG. 12 illustrates a mask simulation model for forming the thin film layer 2500 having a structure as illustrated in FIG. 9. FIG. 13 illustrates a mask manufactured based on the simulation model of FIG. 12 by using an actual 3D printer. As will be described later in detail in the manufacturing method, the area of the thin film layer 2500 may be appropriately adjusted by forming the thin film layer 2500 using the mask.

Figure 14:
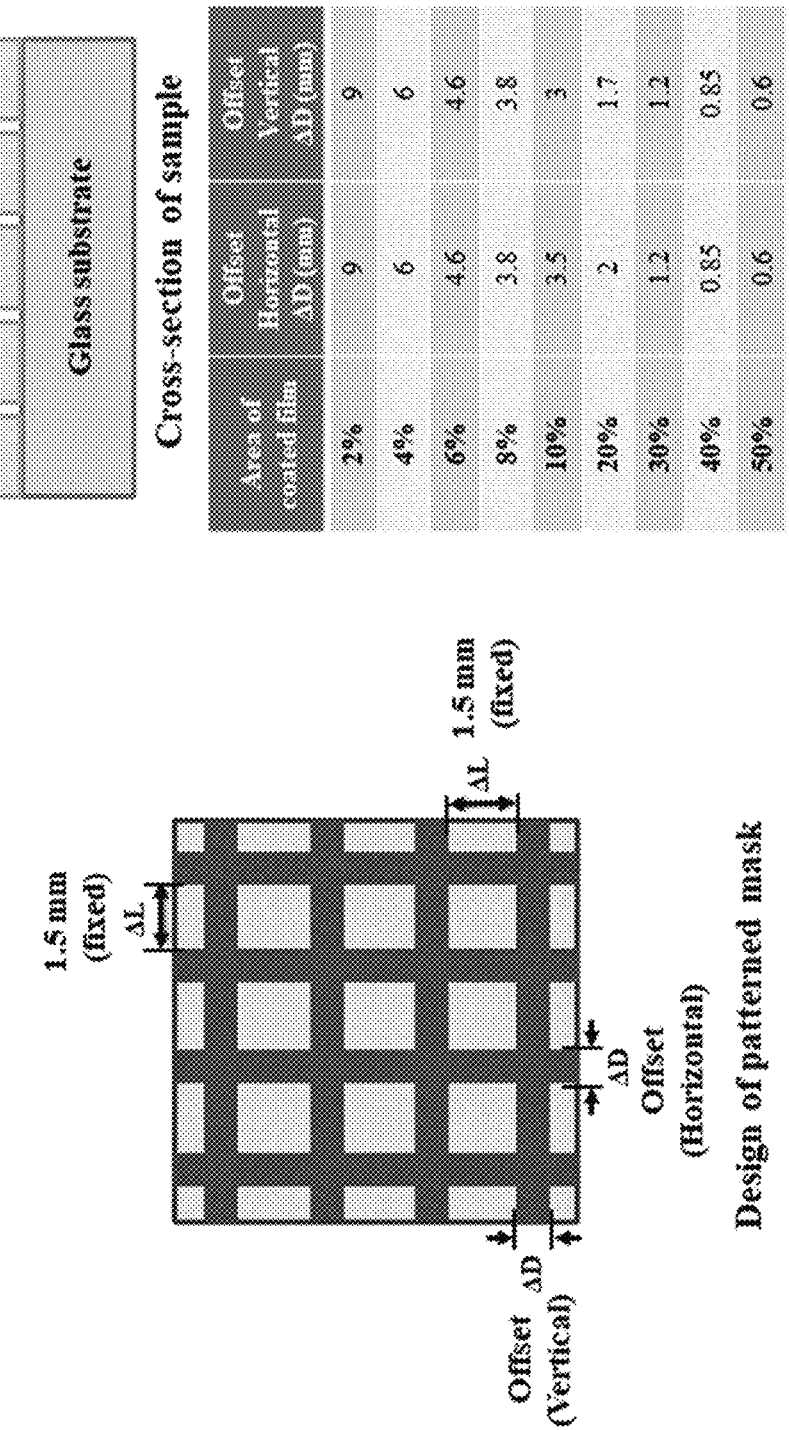
FIG. 14 is a schematic view illustrating a mask design for controlling a surface area of a thin film layer.

FIG. 14 is a schematic view illustrating a mask design for controlling a surface area of the thin film layer 2500. Referring to FIG. 14, widths of vertical and horizontal lattices of the mask may be adjusted in order to control an overlap region of the thin film layer 2500 with the main adhesive layer 2100. That is, an aperture ratio of the mask is controlled by adjusting the widths of vertical and horizontal lattices.

It is possible to control the adhesion between the cover plate 3000 and the adhesive layer 2000 by adjusting the surface area of the second thin film layer 2300 containing fluorine using the mask. As a result, as the area of the second thin film layer 2300 is widened, the adhesion is reduced.

Figure 15:
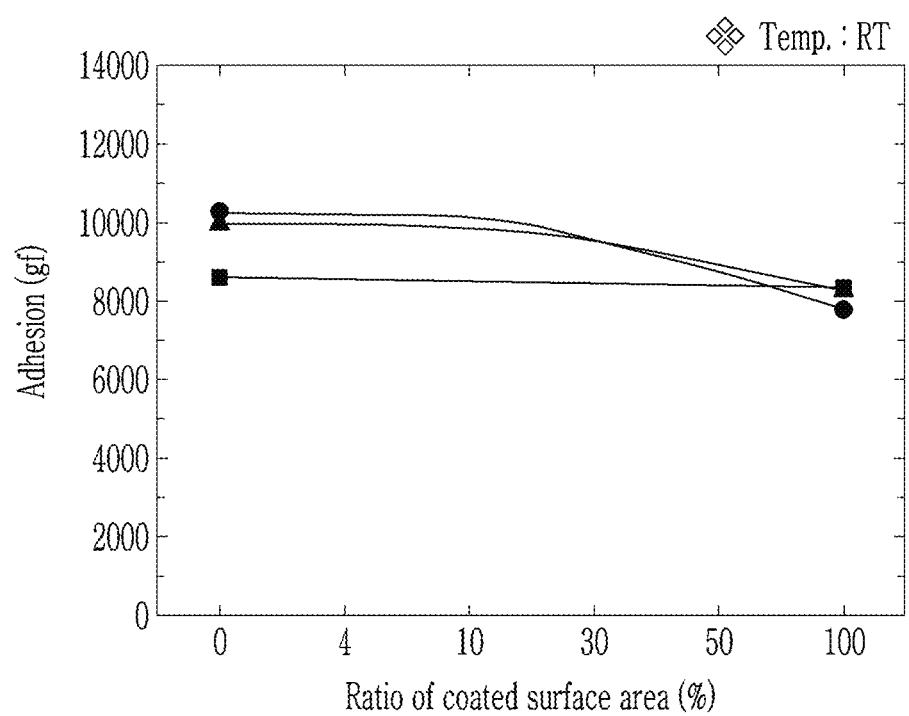
FIG. 15 is a graph illustrating adhesion measured while increasing a surface area of a second thin film layer.

FIG. 15 is a graph illustrating adhesion measured vs. a ratio of the coated surface area of the second thin film layer 2300. Referring to FIG. 15, it is seen that as the surface area of the second thin film layer 2300 is increased, adhesion with the first light blocking member BM1, the second light blocking member BM2, and the cover window WG constituting the cover plate 3000 is reduced.

As described above, the adhesion of the adhesive layer 2000 is reduced by the introduction of the second thin film layer 2300, to have adhesion of about 90% as compared with the adhesive layer 2000 not including the second thin film layer 2300. In this case, it is possible to easily remove the adhesive layer 2000 without leaving any residue thereof when the rework is performed even while maintaining an adhesive characteristic.

Figure 16:
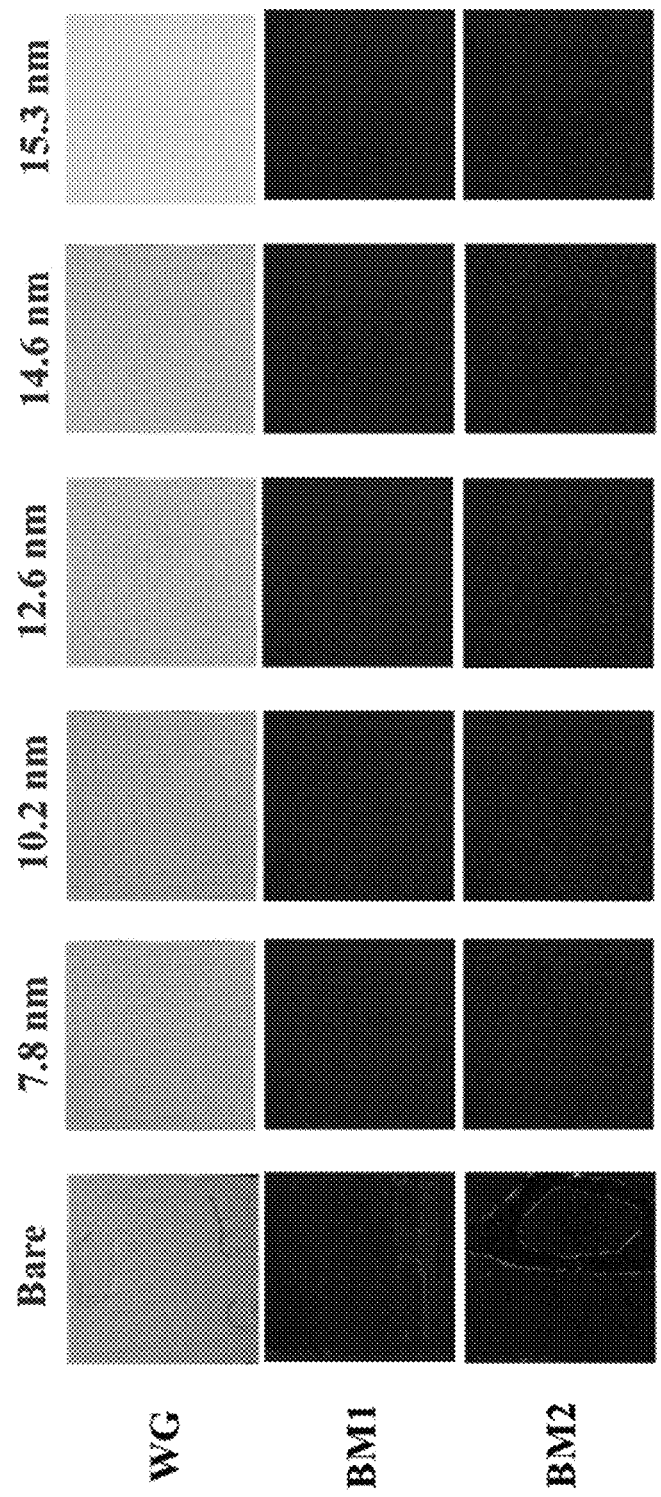
FIG. 16 illustrates a rework characteristic according to a thickness of a second thin film layer.

FIG. 16 illustrates a rework characteristic according to a thickness of the second thin film layer 2300. Referring to FIG. 16, a residual adhesive layer was observed in the rework in a comparative example (Bare) not containing the second thin film layer 2300. However, in the case of including the second thin film layer 2300 containing fluorine, no residual adhesive layer was observed in the rework.

Hereinafter, a manufacturing method of a display device according to another exemplary embodiment of the present invention will be described.

According to the present exemplary embodiment, the manufacturing method of the display device includes preparing a display panel, forming an adhesive layer on the display panel, and attaching a cover plate onto the adhesive layer, and the forming of the adhesive layer includes preparing a main adhesive layer, forming a first thin film containing a siloxane functional group on the main adhesive layer, and forming a second thin film layer containing fluorine on the first thin film layer.

In this case, the forming of the first thin film layer containing a siloxane functional group on the main adhesive layer and the forming of the second thin film layer containing fluorine on the first thin film layer may be performed by using a thermal vacuum deposition method, a spray coating method, or a dip coating method.

Descriptions related to the first thin film layer and the second thin film layer are the same as those described above. That is, the thickness of the first thin film layer may be in a range of 1 nm to 10 μm, and the thickness of the second thin film layer may be in a range of 1 nm to 10 μm.

The first thin film layer may contain a compound represented by following Chemical Formula 1.

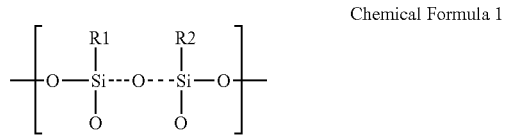

Chemical Formula 1

Here, R1 and R2 indicate carbon-containing functional groups. For example, R1 and R2 may indicate a C1 to C30 alkyl or alkenyl.

The second thin film layer may include a compound represented by following Chemical Formula 2.

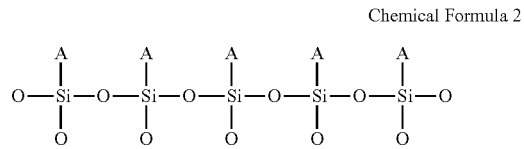

Chemical Formula 2

Here, A indicates a fluorine-containing functional group.

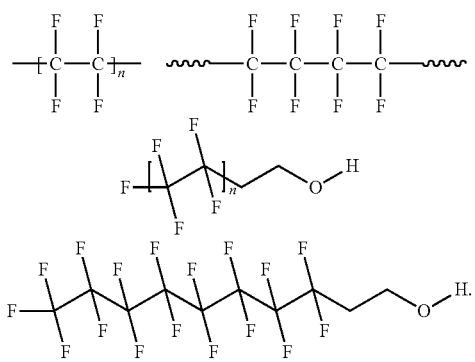

Hereinafter, the forming of the adhesive layer will be described in more detail. The forming of the adhesive layer includes preparing a main adhesive layer, forming a first thin film layer containing a siloxane functional group on the main adhesive layer, and forming a second thin film layer containing fluorine on the first thin film layer.

The first thin film layer and the second thin film layer may be formed by various methods including dry or wet methods. For example, they may be formed by using a spray coating method. The present exemplary embodiment will be described in detail based on the spray coating method.

Figure 17:
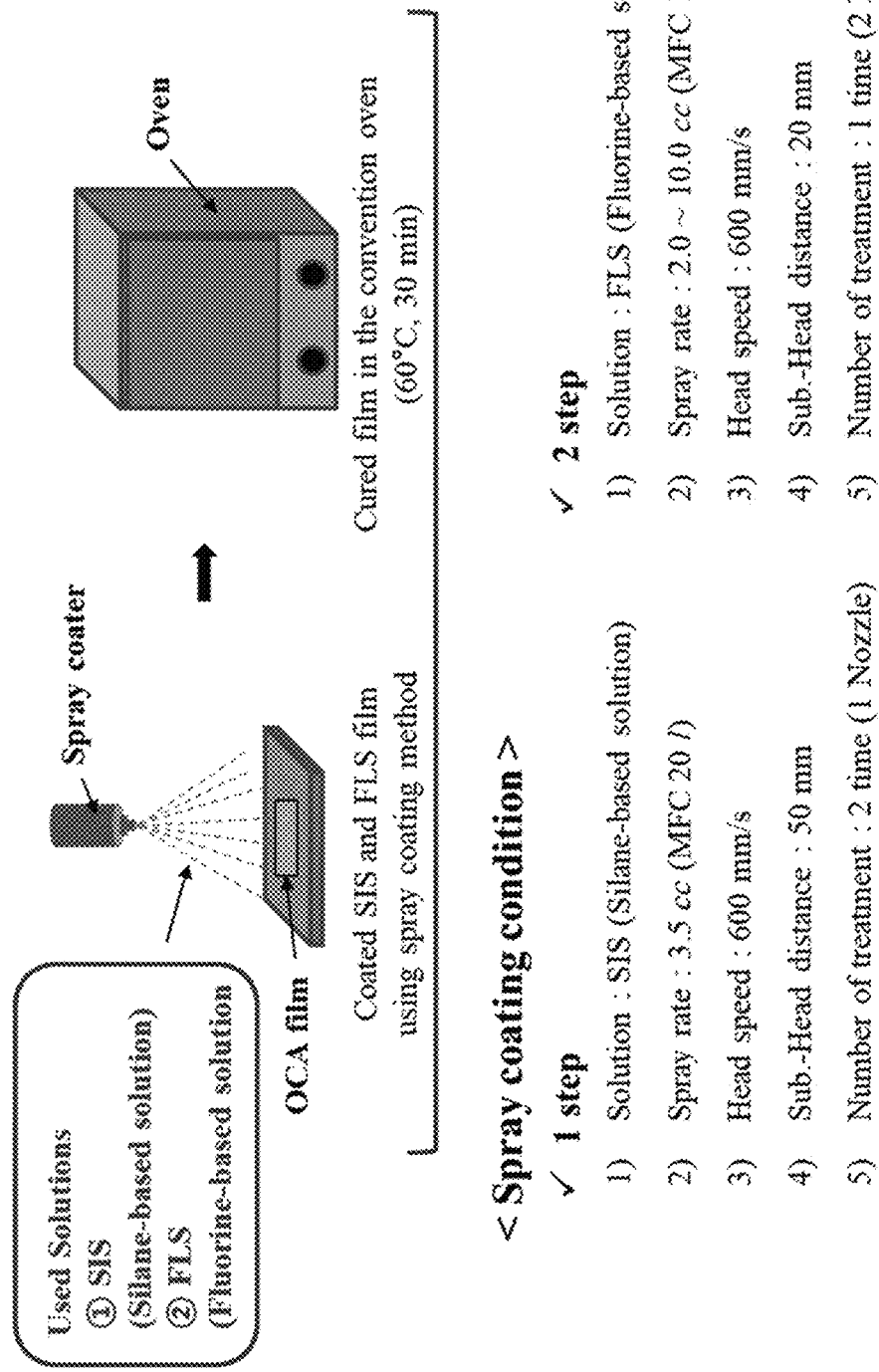
FIG. 17 is a schematic view illustrating steps of forming an adhesive layer according to an exemplary embodiment.

FIG. 17 is a schematic view illustrating steps of forming an adhesive layer according to the present exemplary embodiment.

First, a siloxane functional group-based solution is coated on the main adhesive layer. In this case, the siloxane functional group-based solution may have a contact angle that is in a range of 40° to 60°, or 60° or more, and surface energy that is in a range of 40 mN/m to 60 mN/m, or 40 mN/m or less.

In the present exemplary embodiment, a coating condition of the siloxane functional group-based solution will be described as follows. An injection quantity thereof may be 3.5 cc, and an injection rate thereof may be MFC 20 L. The coating may be performed at a spray head speed of 600 mm/s. A distance between the substrate and the head may be 50 mm, and the spray processing may be performed two times with 1 nozzle.

Next, a fluorine-based solution is coated. The fluorine-based solution may have a contact angle that is in a range of 65° to 85° and surface energy that is 15 mN/m or less.

In the present exemplary embodiment, a coating condition of the fluorine-based solution will be described as follows. An injection quantity thereof may be in a range of 2.0 to 10.0 cc, and an injection rate thereof may be MFC 10 L. The coating may be performed at a spray head speed of 600 mm/s. A distance between the substrate and the head may be 20 mm, and the spray processing may be performed one time with 2 nozzles.

Next, the coated thin film is put in an oven at a temperature of 50° C. to 70° C. for 20 to 40 minutes.

In this process, the adhesive layer 2000 may be formed, and the display panel 1000 and the cover plate 3000 may be attached to each other by using the adhesive layer 2000.

Hereinafter, the display panel 1000 according to an exemplary embodiment of the present invention will be briefly described. The display panel 1000 may be an organic light emitting diode display panel.

Figure 18:
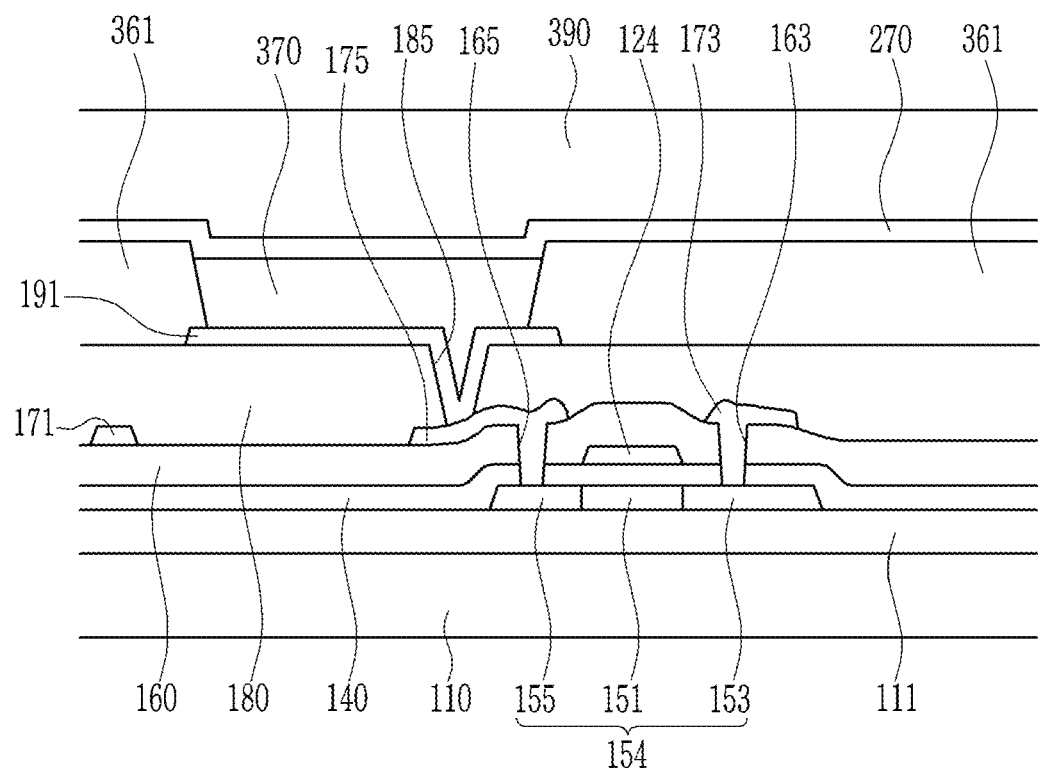
FIG. 18 is a cross-sectional view illustrating a display panel according to an exemplary embodiment of the present invention.

FIG. 18 is a cross-sectional view illustrating a display panel 1000 according to an exemplary embodiment of the present invention. Referring to FIG. 18, a buffer layer 111 made of a silicon oxide or a silicon nitride is disposed on a first substrate 110.

A semiconductor layer 154 is disposed on the buffer layer 111. The semiconductor layer 154 includes a source region 153 and a drain region 155 doped with a p-type impurity, and a channel region 151 positioned between the source region 153 and the drain region 155.

A gate insulating layer 140 may be disposed on the semiconductor layer 154 and the buffer layer 111 to include a silicon oxide or a silicon nitride. A gate electrode 124 is disposed on the gate insulating layer 140 to overlap the channel region 151 of the semiconductor layer 154.

An interlayer insulating layer 160 is disposed on the gate electrode 124 and the gate insulating layer 140. The interlayer insulating layer 160 has a first contact hole 165 and a second contact hole 163.

A data conductor including a data line 171, a source electrode 173, and a drain electrode 175 is disposed on the interlayer insulating layer 160.

The drain electrode 175 is connected with the drain region 155 through the first contact hole 165. In addition, the source electrode 173 is connected with the source region 153 through the second contact hole 163.

A passivation layer 180 is positioned on the data conductor (171, 173, and 175) and the interlayer insulating layer 160, and has a contact hole 185.

A first electrode 191 is disposed on the passivation layer 180. The first electrode 191 may serve as a pixel electrode. The first electrode 191 is connected with the drain electrode 175 through the contact hole 185. A partition wall 361 is disposed on the passivation layer 180. A light-emitting element layer 370 is positioned to overlap the first electrode 191, and a second electrode 270 is positioned to overlap the light-emitting element layer 370. The second electrode 270 may serve as a common electrode.

In this case, the first electrode 191 may serve as an anode, which is a hole injection electrode, and the second electrode 270 may serve as a cathode, which is an electron injection electrode. However, the inventive concepts are not limited thereto, and the first electrode 191 may serve as a cathode and the second electrode 270 may serve as an anode according to a driving method of a display device.

The light-emitting element layer 370 may include an emission layer, an electron transport layer, a hole transport layer, and the like.

An encapsulation layer 390 is disposed to overlap the second electrode 270. The encapsulation layer 390 may be formed to include an organic material or an inorganic material, or may be formed to include an organic material and an inorganic material which are alternately stacked. The encapsulation layer 390 may serve to protect the display device against moisture, heat, and other contamination from the outside.

However, the structure shown in FIG. 18 is merely an example, and the structure of the display panel 1000 is not limited thereto. The display panel 1000 may include seven transistors.

According to exemplary embodiments, it is possible to provide a display area which facilitates rework in a manufacturing process by forming a thin film layer containing siloxane functional group and fluorine in an adhesive layer and adjusting an adhesive characteristic.

Although certain exemplary embodiments have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
a display panel;
a cover plate disposed on the display panel; and
an adhesive layer disposed between the display panel and the cover plate,
wherein:
the adhesive layer comprises a main adhesive layer and a thin film layer;
the thin film layer comprises a first thin film layer and a second thin film layer disposed on the first thin film layer;
the first thin film layer contains a siloxane functional group and the second thin film layer contains fluorine; and
the second thin film layer is disposed between the first thin film layer and the cover plate;
wherein light transmittance in visual light regions of the first thin film layer and the second thin film layer is 92% or more and the haze values of the first thin film layer and the second thin film layer are 0.3 percent or less, and a thickness of the first thin film layer is in a range of 1 nm to 10 μm and a thickness of the second thin film layer is in a range of 1 nm to 10 μm.

2. The display device of claim 1, wherein the second thin film layer contacts the cover plate.

3. The display device of claim 1, wherein the first thin film layer comprises a portion of a compound represented by Chemical Formula 1:

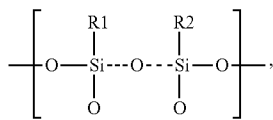

[Chemical Formula 1]

where R1 and R2 indicate carbon-containing functional groups.

4. The display device of claim 1, wherein the second thin film layer includes a portion of a compound represented by Chemical Formula 2:

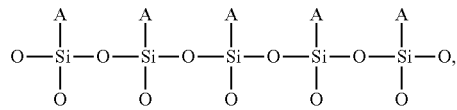

[Chemical Formula 2]

where A indicates a fluorine-containing functional group.

5. The display device of claim 1, wherein the thin film layer is disposed in a region of the main adhesive layer.

6. The display device of claim 5, wherein the thin film layer overlaps an area of 1% to 100% of an entire region of the main adhesive layer.

7. The display device of claim 5, wherein the thin film layer has a shape formed of a plurality of islands that are spaced apart.

8. The display device of claim 5, wherein the thin film layer has a shape formed of a plurality of bars that are spaced apart.

9. The display device of claim 1, wherein a contact angle of the second thin film layer is equal to or greater than 105°.

10. The display device of claim 1, wherein a surface energy of the second thin film layer is equal to or less than 20 mN/m.

11. A manufacturing method of a display device, the method comprising:
preparing a display panel;
forming an adhesive layer on the display panel; and
attaching a cover plate onto the adhesive layer,
wherein:
the forming of the adhesive layer comprises:
preparing a main adhesive layer;
forming a first thin film layer containing a siloxane functional group on the main adhesive layer; and
forming a second thin film layer containing fluorine on the first thin film layer;
the second thin film layer is disposed between the first thin film layer and the cover plate;
wherein light transmittance in visual light regions of the first thin film layer and the second thin film layer is 92% or more and the haze values of the first thin film layer and the second thin film layer are 0.3 percent or less, and a thickness of the first thin film layer is in a range of 1 nm to 10 µm, and a thickness of the second thin film layer is in a range of 1 nm to 10 µm.

12. The manufacturing method of claim 11, wherein the forming of the first thin film layer containing the siloxane functional group on the main adhesive layer and the forming of the second thin film layer containing fluorine on the first thin film layer are performed by using a thermal vacuum deposition method, a spray coating method, or a dip coating method.

13. The manufacturing method of claim 11, further comprising, between the preparing of the main adhesive layer and the forming of the first thin film layer containing the siloxane functional group on the main adhesive layer, positioning a mask on the main adhesive layer.

14. The manufacturing method of claim 13, wherein an opening area of the mask is in a range of 2% to 50%.

15. The manufacturing method of claim 11, wherein the first thin film layer contains a compound represented by Chemical Formula 1, and
the second thin film layer contains a compound represented by Chemical Formula 2:

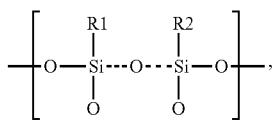

[Chemical Formula 1]

where R1 and R2 indicate carbon-containing functional groups, and

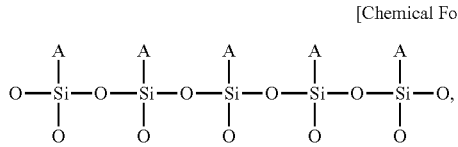

[Chemical Formula 2]

where A indicates a fluorine-containing functional group.

* * * * *